(12) United States Patent
Miyamoto

(10) Patent No.: US 7,683,551 B2
(45) Date of Patent: Mar. 23, 2010

(54) PROCESSING METHOD AND PROCESSING DEVICE OF CONDITIONING ELECTRON GUN

(75) Inventor: Nobuo Miyamoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 373 days.

(21) Appl. No.: 11/860,178

(22) Filed: Sep. 24, 2007

(65) Prior Publication Data
US 2008/0153376 A1    Jun. 26, 2008

(30) Foreign Application Priority Data
Sep. 25, 2006    (JP)    ............................. 2006-259373

(51) Int. Cl.
*H01J 9/50*    (2006.01)
(52) U.S. Cl. .......................................... 315/3; 315/5.38
(58) Field of Classification Search ............... 315/3, 315/5.38, 5.37, 500, 505, 506, 507, 503
See application file for complete search history.

(56) References Cited
U.S. PATENT DOCUMENTS 3,706,002 A * 12/1972 Miram ..................... 315/5.39
4,101,803 A * 7/1978 Retsky et al. ................. 315/3

FOREIGN PATENT DOCUMENTS

| JP | 9-45247 | 2/1997 |
|---|---|---|
| JP | 2005-26112 | 1/2005 |

* cited by examiner

*Primary Examiner*—David Hung Vu
(74) *Attorney, Agent, or Firm*—Oblon, Spivak, McClelland, Maier & Neustadt, L.L.P.

(57) ABSTRACT

Discharge factors existing on a surface of an electrode or an insulator forming an electron gun are removed efficiently and effectively, thus simply and easily enhancing the withstand voltage property of the electron gun. A conditioning processing device of an electron gun is provided with a voltage supply section, a voltage adjusting section for adjusting the output voltage of the voltage supply section, and a current detection section for detecting a leakage current flowing between the electrodes of the electron gun. Further, there are attached a vacuum exhaust section for adjusting the inside of the electron gun in a reduced pressure condition and a pressure detection section. Further, it is arranged that a personal computer (PC), for example, performs data processing based on the leakage current detected by the current detection section or comparison with a reference value thereof to control the voltage, which is applied between the electrodes from the voltage supply section via a connection section, via the voltage adjustment section.

14 Claims, 7 Drawing Sheets

PROCESSING METHOD AND PROCESSING DEVICE OF CONDITIONING ELECTRON GUN

CROSS REFERENCE TO RELATED APPLICATION

This application is based upon and claims the benefit of priority from the prior Japanese Patent applications No. JP2006-259373, filed on 25 Sep. 2006; the entire contents of which are incorporated herein by reference.

BACKGROUND OF THE INVENTION

The present invention relates to a processing method and a processing device of conditioning an electron gun to improve the withstand voltage property thereof by removing a factor of discharge existing on a surface of an electrode or an insulator forming the electron gun.

As shown in a schematic cross-sectional view of FIG. 6, an electron gun 100 used, for example, for an electron beam drawing device is disposed above an electron optical body tube 101, and is provided with a pair of first electrodes 102 (102a, 102b), a second electrode 102, and a third electrode 104 (e.g., a Wehnelt electrode).

Here, in the operation of the electron beam drawing device, the inside of the electron beam 100 and the electron optical body tube 101 is maintained in a high vacuum condition (e.g., about $10^{-7}$ Pa), and a high voltage of about 50 kV, for example, is applied between a cathode 105 attached on the tips of the first electrodes 102 and the third electrode 104 (an anode). Then, a thermion is emitted form the cathode 105 made of lanthanum hexaboride (LaB6) in accordance with a voltage (not shown) applied between the first electrodes 102a and 102b, and accelerated by the high voltage described above to be discharged as an electron beam 106 inside the electron optical body tube 110. The electron beam 106 is shaped to have a desired shape by various kinds of lenses, various kinds of deflectors, a beam shaping aperture, and so on (not shown) disposed inside the electron optical body tube 101 to be used for drawing.

In the electron gun 100 described above, the third electrode 104 is connected to a negative pole side of a high voltage source 108 via an extraction electrode 107 and the first electrodes 102 are connected to the negative pole side of the high voltage source 108 described above via a bias power source 109. Thus, the third electrode 104 becomes, for example, about 500V higher than the first electrodes 102 in the negative pole direction. Further, the second electrode 103 is connected to a positive pole side of the high voltage source 108 to be kept at the ground potential. Here, although not shown in the drawings, the first electrodes 102a, 102b, the second electrode 103, and the third electrode 104 made, for example, of stainless steel are separated to be isolated with, for example, ceramics insulators.

When the high voltage is applied to such an electron gun 100 as described above, abnormal discharge caused by a discharge factor such as a protruding section like a burr or a scratch, or an attachment like dust on the surface of the electrode occurs among the electrodes, particularly between the second electrode 103 and the third electrode 104 in some cases. In other cases, massive creeping discharge caused by a discharge factor such as an impurity or attachment on the surface of the insulator between the electrodes occurs. The frequency of such abnormal discharge is high in the initial stage of several tens of hours from the commencement of use of an electron gun after attaching the new electron gun, replacing the electron gun, or maintenance of the electron gun.

The generation of the abnormal discharge cases, for example, voltage drop of about 500V in the operation of the high voltage source 108 of the electron beam drawing device to stop the operation thereof. Further, the electron bean originally required in an electron beam drawing process disappears to cause the production yield to be lowered by deterioration of the drawing accuracy, and to cause the operation rate of the drawing device to be lowered by stopping the operation of the drawing device.

Therefore, in order for suppressing or preventing such generation of the abnormal discharge, it is generally performed to execute a conditioning process (also referred to as a knocking process) of the electron gun after attaching or replacing with a new electron gun or after the maintenance of the electron gun (see, JP-A-2005-026112).

The conditioning process performed generally will be explained with reference to FIGS. 6 and 7. FIG. 7 is a graph showing an example of a waveform of a voltage applied to the electrodes of the electron gun in the conditioning process in the related art. In the conditioning process of the electron gun 100 shown in FIG. 6, for example, the inside of the electron optical body tube 101 and the electron gun 100 communicated therewith is evacuated to be high vacuum (e.g., $10^{-5}$ Pa) by a vacuum exhaust device (not shown) disposed below the electron optical body tube 101. Then, the voltage application between the first electrodes 102a and 102b is stopped to keep the emission of a thermion from the cathode 105 stopped, and the negative voltage of the high voltage source 108 is applied to the first electrodes 102 via the bias power source 109, and directly to the third electrode 104. Further, the second electrode 103 is fixed to the ground potential.

In this case, the absolute value of the negative voltage of the high-voltage source 108 is gradually increased from a low application voltage to a high voltage stepwise at constant time intervals as time passes as shown in FIG. 7. For example, the application voltage is increased in the condition of rising by 1 kV through 5 kV in one minute interval, thus performing the conditioning process of the electron gun 100. Then, the highest value of the application voltage is set, for example, to about 1.6 times of 50 kV, which is an actual working voltage of the electron gun, namely 80 kV, and the voltage of the highest value is held for a predetermined period, for example, about 10 minutes while confirming that no abnormal discharge occurs, and then the conditioning process is terminated. If the abnormal discharge occurs in the termination judgment of the conditioning process, the voltage is lowered to a predetermined value and the conditioning process is performed again from the lowered voltage, and is repeated until the abnormal discharge described above stops occurring.

By executing such a conditioning process, namely electrode spark erosion, on the electron gun, the discharge factors described above on the surfaces of the first electrodes 102, the second electrode 103, the third electrode 104, and the insulators described above are eliminated, thus the withstand voltage property of the electron gun is improved.

However, in the past conditioning process of the electron gun, there are some cases in which massive discharge occurs at a high frequency in the conditioning process, the discharge causing damages such as roughening or cracks on the surfaces of the electrodes or the insulators of the electron gun. For example, the massive discharge makes a crater-shaped breakage on the surface of the electrode, and the small fragment adheres to another place and remains there. Therefore, the life of the electron gun is problematically shortened.

Further, it has been proved that if the microscopic protrusion, impurity, and attachment causing the microscopic discharge is not sufficiently removed in the conditioning process, the abnormal discharge caused by the factor of the microscopic discharge described above is apt to occur in the actual use of the electron gun. Further, it has been proved that in the past conditioning processing method, the factors of the microscopic discharge including the fragment described above cannot sufficiently be removed, and accordingly there is a limitation in improvement of the withstand voltage property of the electron gun.

Such a problem occurs not only in the case with the electron gun implemented in the electron bean drawing device described above, but also in the case with electron guns to be other electron sources for emitting electrons by high electric fields as well.

SUMMARY

The present invention is made in consideration of the above circumstances, and has an object of providing a processing method and a processing device of the conditioning for efficiently and effectively removing the discharge factor existing on the surfaces of the electrodes or the insulators forming the electron gun, thereby improving the withstand voltage property of the electron gun.

In order for achieving the above object, a conditioning processing method of an electron gun according to the present invention includes the steps of removing a discharge factor existing on a surface of one of an electrode and an insulator by increasing voltage applied to the electrode stepwise and gradually, the electrode and the insulator forming an electron gun, detecting a leakage current, and controlling the voltage in accordance with the leakage current.

Further, a conditioning processing device of an electron gun according to the present invention, removing a discharge factor existing on a surface of one of an electrode and an insulator by increasing voltage applied to the electrode stepwise and gradually, the electrode and the insulator forming an electron gun, includes a voltage supply for supplying a stepwise voltage, a leakage current detector for detecting a leakage current of the electrode in accordance with application of the voltage, a data processor for processing detection data from the leakage current detector, and a voltage adjuster for adjusting the voltage supplied from the voltage supply in accordance with processing data from the data processor.

In the conditioning processing method described above, it is preferable that the inside of the electron gun is evacuated and is set in a gas atmosphere with predetermined pressure. Further, the gas is preferably a nitrogen gas.

Further, the conditioning processing device of the electron gun is preferably provided with a atmosphere controller for evacuating the electron gun and holding the gas atmosphere with predetermined pressure.

According to the present invention, discharge factors existing on a surface of an electrode or an insulator forming an electron gun are removed efficiently and effectively, thus the withstand voltage property of the electron gun can simply and easily be enhanced.

DESCRIPTION OF THE EMBODIMENTS

Figure 1:
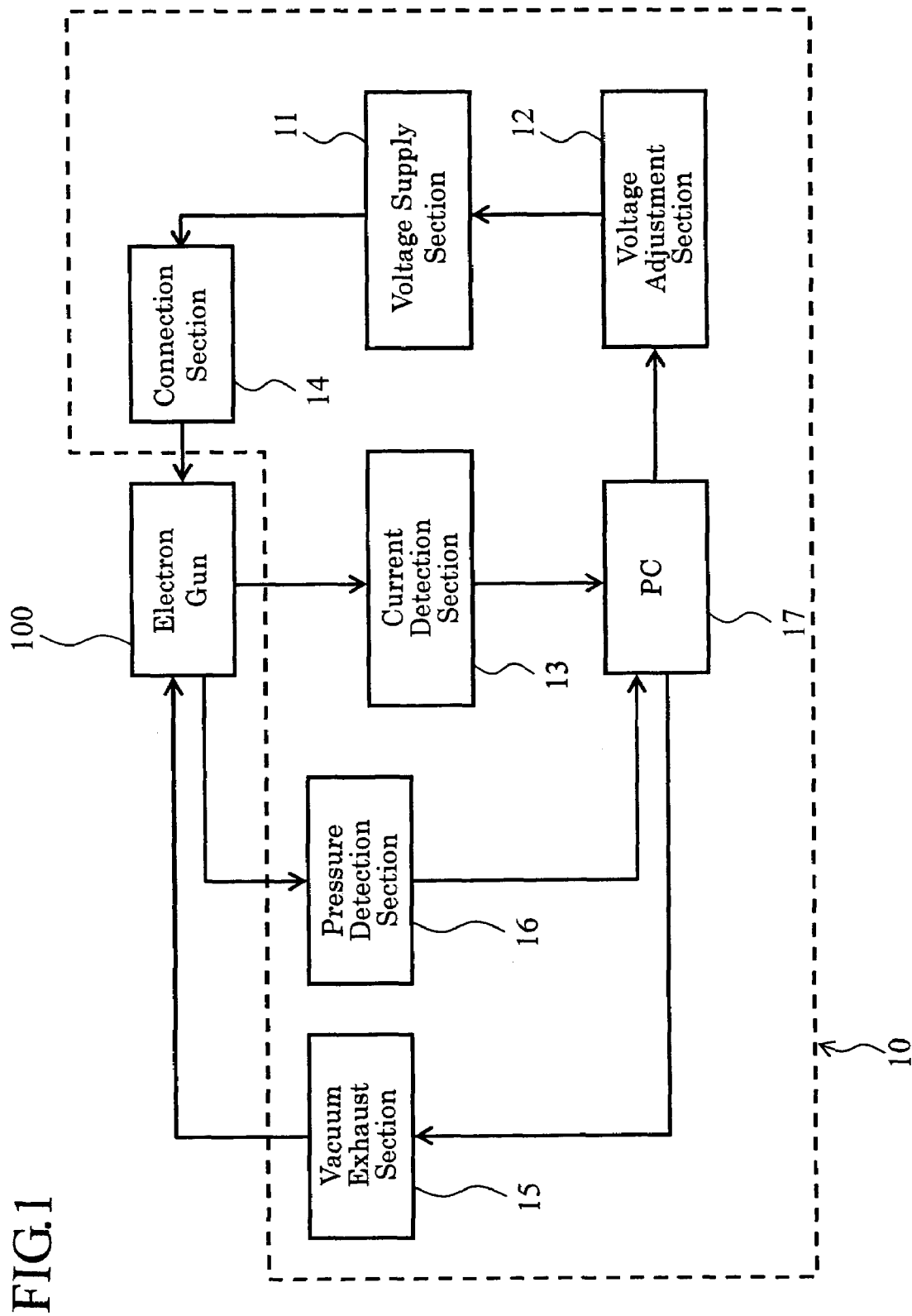
FIG. 1 is a schematic configuration diagram showing an example of a conditioning processing device of an electron gun according to a first embodiment.

A preferred embodiment of the invention will hereinafter be described with reference to the accompanying drawings. In the drawings, the same or similar sections to each other will be denoted with a common reference numeral, and the duplicated explanations therefor will be omitted.

First Embodiment

Figure 6:
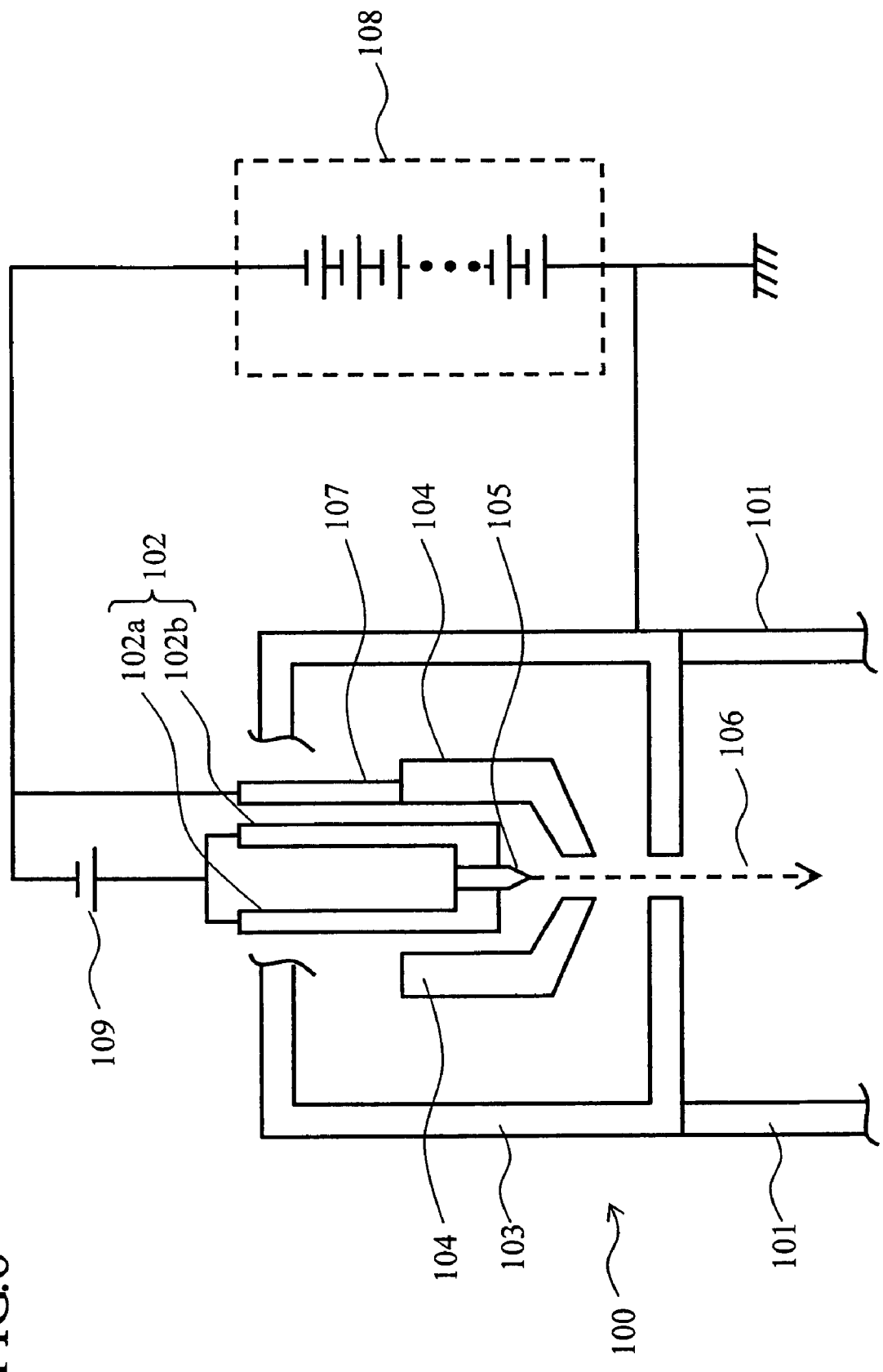
FIG. 6 is a schematic cross-sectional view showing an example of the electron gun for explaining the present embodiment.
Figure 7:
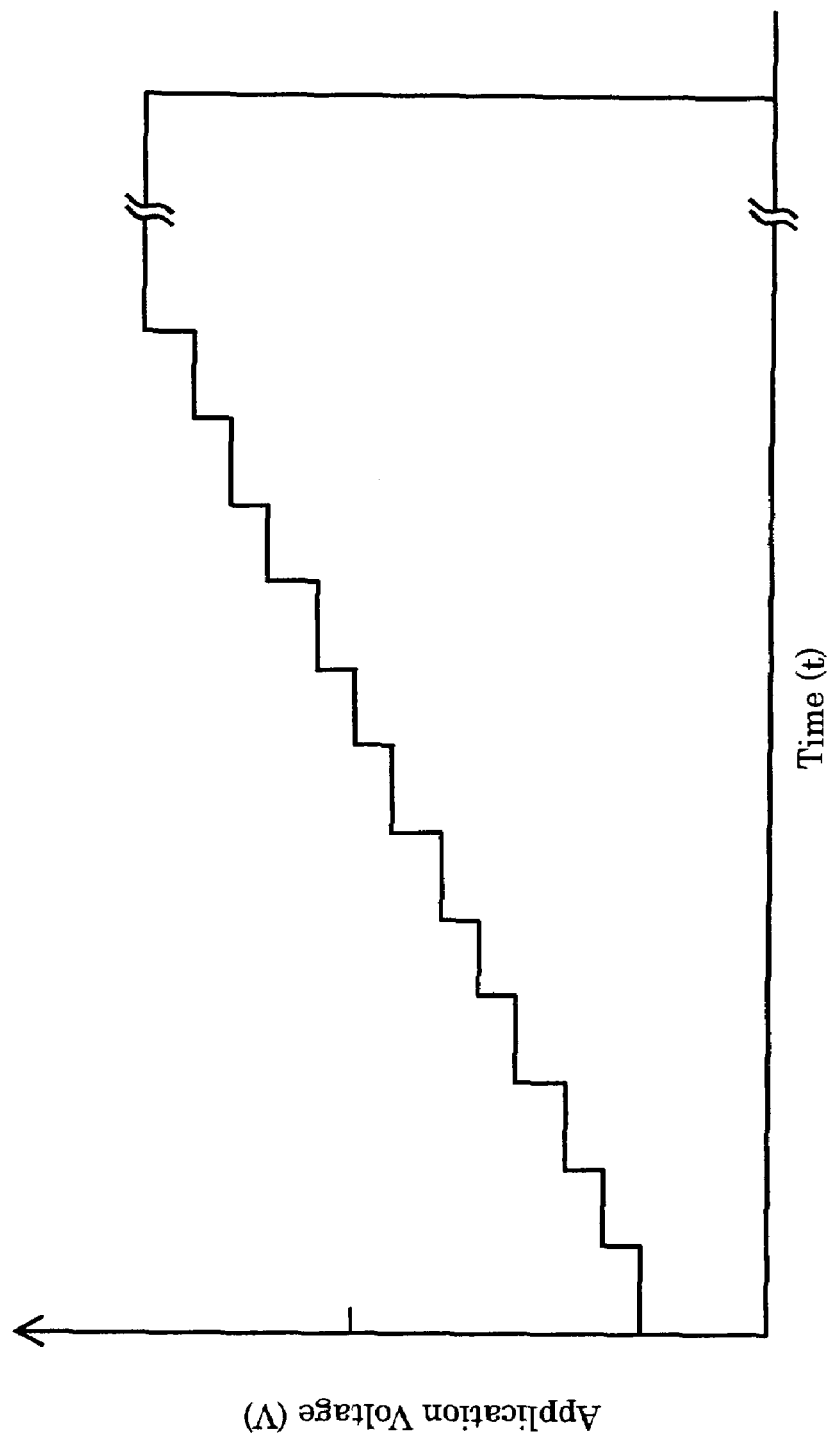
FIG. 7 is a graph showing an example of the waveform of the application voltage to the electron gun for explaining the conditioning processing method of the related art.

FIG. 1 is a schematic configuration diagram showing an example of a conditioning processing device of an electron gun according to a first embodiment. Here, although it is sufficient that the electron gun is an electron source for emitting an electron by a high electric field, the following embodiment is explained using an example of the electron gun attached to an electron beam drawing device as shown in FIG. 6.

As shown in FIG. 1, the conditioning processing device 10 of the electron gun of the present embodiment is provided with a voltage supply section 11 for supplying the electron gun 100 with a high voltage, a voltage adjustment section 12 for adjusting the voltage value of the voltage supply section 11, and a current detection section 13 for detecting the leakage current flowing between the electrodes of the electron gun 100. Here, it is arranged that the voltage supply section 11 applies a negative high voltage to the first electrodes 102 and the extraction electrode 107 connected thereto by a connection section 14. Further, a vacuum exhaust section 15 and a pressure detection section 16 for adjusting the inside of the electron gun 100 to be in a reduced pressure condition are attached.

Further, a personal computer (PC) 17, for example, is provided for performing data processing such as an operation using the detection data like the leakage current detected by the current detection section 13 and a degree of vacuum of the inside the electron gun detected by the pressure detection section 16, and further for collectively controlling the conditioning processing device 10.

The voltage supply section 1 forms a voltage supply unit, and is equipped with a direct current high voltage generator capable of boosting a voltage to a negative high voltage. The high voltage generator is connected to the first electrodes 102 and the third electrode 104 of the electron gun 100 in the negative side thereof via the connection section 14, and is connected to the ground in the positive side, for example, via a discharge protective resistance. Further, the high voltage described later is applied between the first electrodes 102 and the second electrode 103 and between the third electrode 104 and the second electrode 103 so as to increase gradually and stepwise. The high voltage generator described above has, for example, a well-known multistage booster structure in which a voltage is boosted via capacitors. It should be noted here that as the high voltage generator, a high voltage generator used for the actual operation of the electron gun 100 can directly be used, or a separate variable voltage high voltage generator from the one used for the actual operation can be arranged to be used therefor.

The voltage adjustment section 12 forms a voltage adjustment unit, and boosts or deboosts the direct current output voltage from the high voltage generator of the voltage supply section 11 as desired in accordance with a command from the PC 17. Specifically, it boosts the output voltage stepwise to a voltage one step higher than the output voltage at some timing or deboosts it stepwise to a voltage one step or several steps lower. By performing as described above, as described in detail later, the high voltage between the electrodes of the electron gun is applied while gradually boosted stepwise at some timing.

The current detection section 13 forms a leakage current detection unit, and is provided with an ammeter to detect the leakage current flowing between the first electrodes 102 and the second electrode 103 and between the third electrode 104 and the second electrode 103. Further, the current detection section 13 is arranged to have an A/D converter built-in to A/D-convert the leakage current into a digital signal, thus supplying the PC 17 with the detection data. Alternatively, it can also be arranged to sample the leakage current value in predetermined time intervals, thus supplying the PC 17 with the detection data. Further, the current detection section 13 can equipped with a circuit configuration capable of comparing a reference value of the leakage current set previously with the discharge current, and further of judging the magnitude relation with the reference value. In this case, the current detection section 13 forms a data processing unit together with the PC 17.

Here, the ammeter can detect the potential appearing in the resistance on the positive side of the high voltage generator described above, or have a structure for measuring, for example, the current of an induction coil electromagnetically coupled with a conductive wire with which the positive side of the high voltage generator is grounded. Further, it is preferable that the leakage current is arranged to be displayed by a device such as an oscilloscope.

The vacuum exhaust section 15 is a vacuum exhaust device equipped with a vacuum pump such as an ion pump or a turbo-molecular pump, and is preferably a device for controlling the degree of vacuum inside the electron gun in the low pressure of $10^{-5}$ Pa or lower, and forms an atmosphere control unit. The vacuum exhaust device used for decreasing the pressure of the electron optical body tube 101 of the device in which the electron gun is implemented such as an electron beam drawing device shown in FIG. 6 is used also as such a vacuum exhaust device. Alternatively, it is possible that a separate vacuum exhaust device is provided.

The pressure detection section 16 forms the atmosphere control unit as well, and is equipped with an ionization vacuum gauge such as a normal B-A gauge to be arranged to detect the degree of vacuum inside the electron gun 100, thus supplying the PC 17 with the detection data.

The PC 17 is formed, for example, of a laptop personal computer including a microprocessor (MPU) built-in, performing data processing such as various arithmetic processing, and provided with a memory section, an input/output section, and a display section, and forms a data processing unit. Further, such a personal computer briefly performs the overall control in the conditioning process of the electron gun. As described above, the PC 17 performs data processing in accordance with the data such as the leakage current detected by the current detection section 13 or the magnitude relation between the leakage current and the reference value, and controls the voltage adjustment section 12 by providing instructions thereto so that the output voltage of the voltage supply section 11 becomes a desired voltage. It should be noted here that the PC 17 can be configured to compare the leakage current detected by the current detection section 13 with the reference value thereof to perform arithmetic processing of the magnitude relation. Although the details thereof will be described later, the reference value of the leakage current described above is designated as desired from the input/output section of the PC 17.

Further, the PC 17 controls the vacuum exhaust section 15 based on the detection data such as the degree of vacuum inside the electron gun 100 supplied from the pressure detection section 16 so that the degree of vacuum inside the electron gun becomes the constant pressure of, for example, about $10^{-5}$ Pa.

Further, the PC 17 is equipped with a timer inside thereof to control the elapsed time of the conditioning process.

Figure 2:
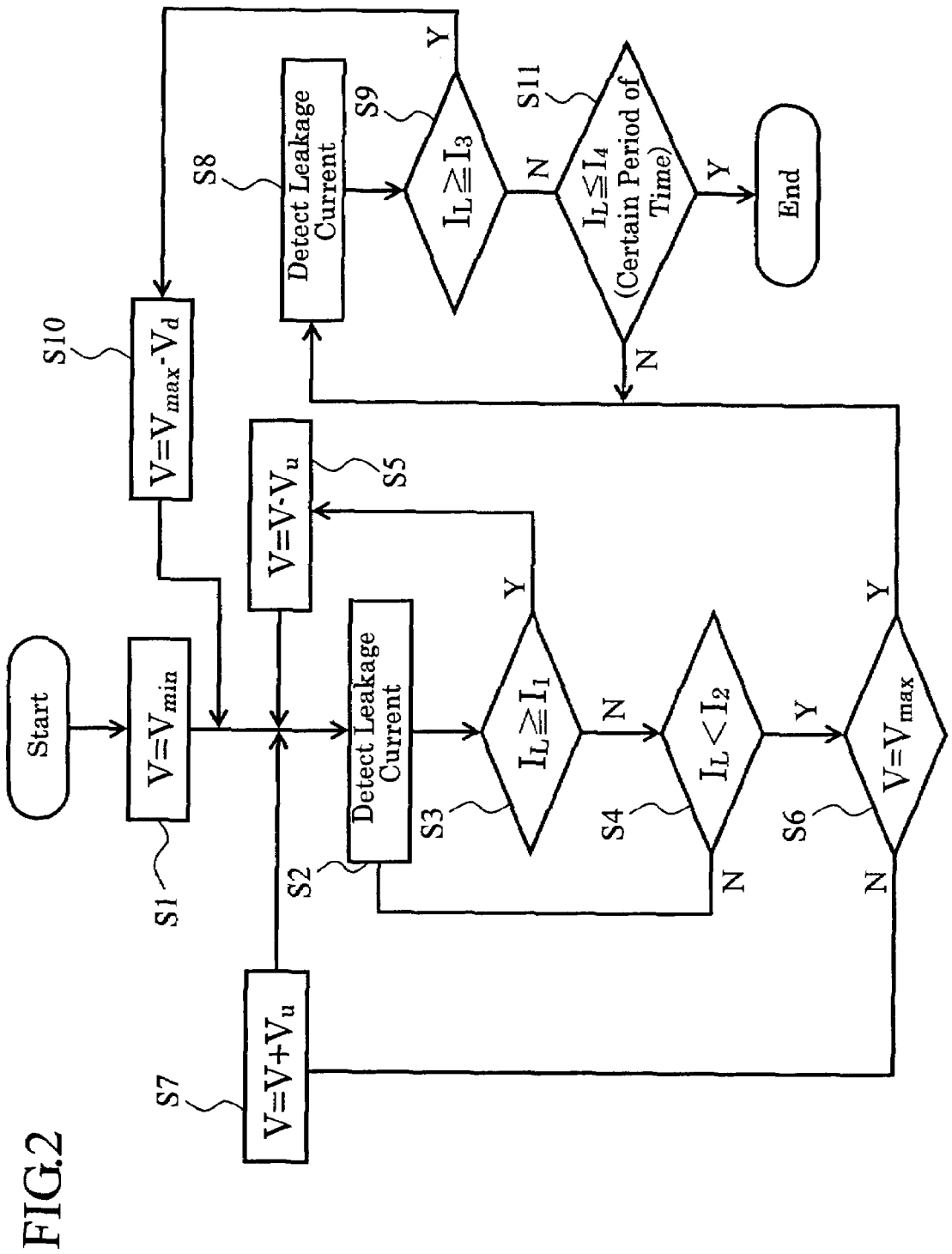
FIG. 2 is a flowchart showing the operation of the conditioning processing device according to the first embodiment.
Figure 3:
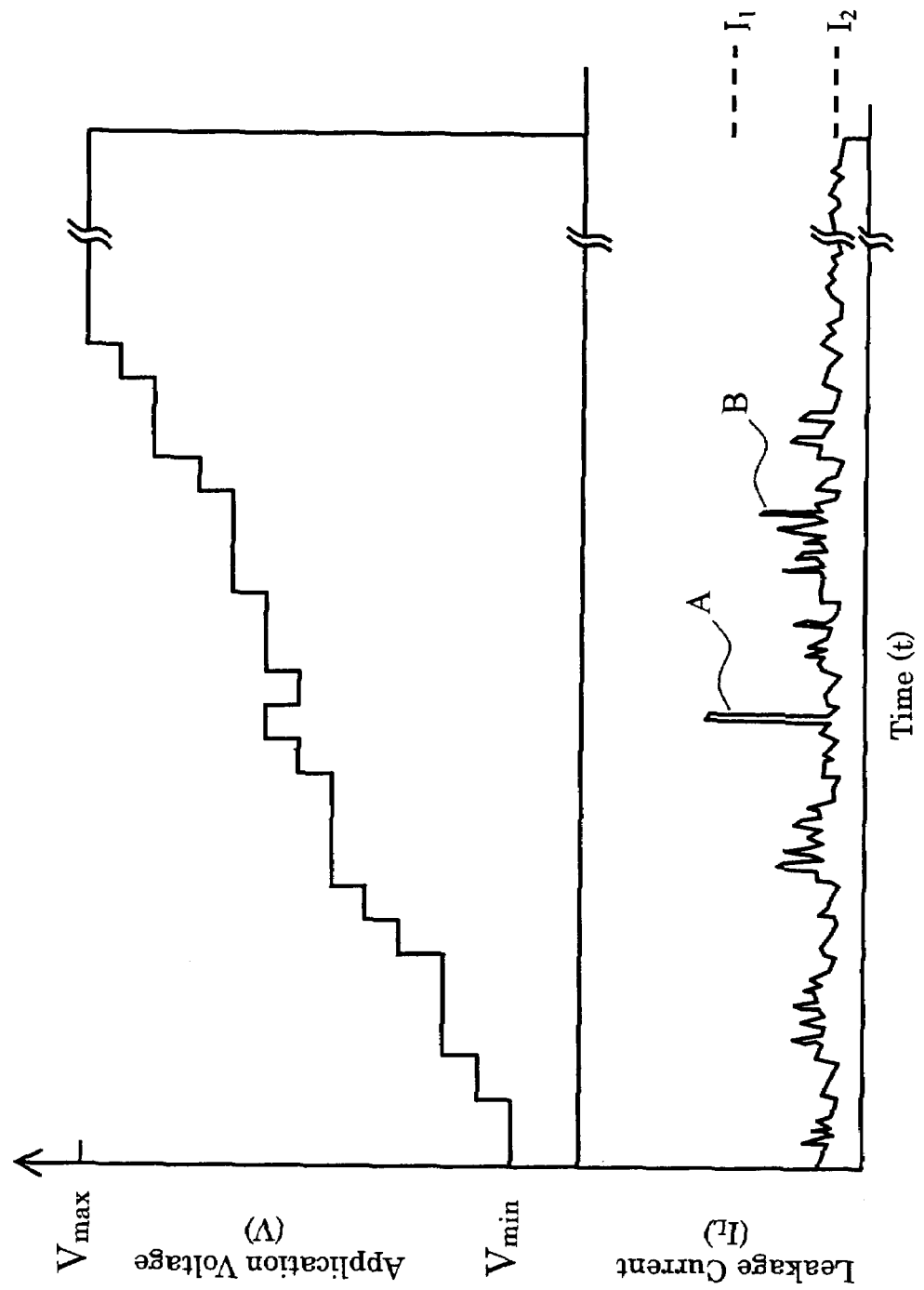
FIG. 3 is a graph showing an example of the waveform of an application voltage and the waveform of a leakage current in the operation of the conditioning processing device according to the first embodiment.

Hereinafter, the operation of the conditioning processing device of the electron gun according to the present embodiment will be explained with reference to FIGS. 1, 2, 3, and 6. Further, the conditioning processing method of the electron gun according to the present embodiment will be described in the explanation of the operation. Here, FIG. 2 is a flowchart showing the operation of the conditioning processing device. FIG. 3 is a graph showing an example of the waveform of an application voltage and the waveform of a leakage current in the operation of the present conditioning processing device.

For example, in the conditioning process of the electron gun 100, the inside of the electron gun 100 is evacuated by the vacuum exhaust section 15 explained with FIG. 1 to be, for example, $1 \times 10^{-5}$ Pa. Subsequently, in the step S1 shown in FIG. 2, the application voltage as the output voltage from the voltage supply section 11 shown in FIG. 1 is set to V=Vmin, the minimum negative voltage Vmin minimizing the absolute value in the conditioning process is applied between the first electrodes 102 and the second electrode 103 and between the third electrode 104 and the second electrode 103, while the second electrode 103 of the electron gun 100 is grounded. Here, Vmin is a voltage value previously setup-input from the PC 17.

Further, while keeping the application voltage to V=Vmin, in the step S2 in FIG. 2, the leakage current IL between the first electrodes 102 and the second electrode 103 and between the third electrode 104 and the second electrode 103 is detected by the current detection section 13, and a comparative judgment as described later is performed. As shown in the waveform of the application voltage of FIG. 3, when the application voltage is boosted stepwise to V=Vmin, a charge current (not shown) to the capacitor of the high voltage generator appears for a moment (for about one second) as the leakage current IL at the moment of boosting. However, the charge current is determined by the circuit characteristics of the high voltage generator such as the capacitance, and accordingly is excluded from detection of the leakage current IL.

In general, in such leakage current detection, the leakage current IL is gradually lowered as time passes from the moment of the boosting while showing a small discharge current as shown in the waveform of the leakage current of FIG. 3. Therefore, as shown in the waveform of the leakage current of FIG. 3, a first reference value I1 and a second reference value I2 of the leakage current IL are set, and the magnitude relation between the leakage current IL and the first and the second reference values I1, I2 is comparatively judged. The judgment is performed, as described above, by the PC 17 performing the data processing of the leakage current detection data supplied from the current detection section 13 or the magnitude relation data described above.

Here, the first reference value I1 is set for suppressing or preventing a damage caused on the surfaces of the electrodes of the electron gun by the massive discharge, and the second reference value I2 is set as a reference for boosting the application voltage V to a voltage Vu one step higher than the application voltage V. The voltage Vu is a value set arbitrarily, and is previously determined in, for example, the range of 1 kV through 5 kV described in the related art section.

In the step S3 of FIG. 2, if the judgment of whether or not the leakage current IL is equal to or larger than I1 is NO (N), the judgment of whether or not the leakage current IL is smaller than I2 is performed in the step S4, and if the judgment is N, the leakage current detection is continued. On the other hand, if the judgment whether or not the leakage current IL is equal to or larger than I1 has turned out YES (Y), the PC 17 sends an instruction for deboosting the application voltage V immediately to the voltage adjustment section 12 in the step S5 to make the output voltage of the voltage supply section 11 be deboosted by the voltage Vu with the instruction, and then performs the same leakage current detection as described above with the application voltage of V−Vu.

Further, the judgment of whether or not the leakage current IL is smaller than I2 is performed in the step S4, and if the judgment turns out Y, the process proceeds to the judgment whether or not the application voltage V is equal to Vmax in the step S6. It should be noted here that Vmax is the maximum negative voltage with the maximum absolute value in the conditioning process. If the application voltage V has not reached Vmax in the step S6, the PC 17 sends an instruction for boosting the application voltage V immediately to the voltage adjustment section 12 in the step S7 to make the output voltage of the voltage supply section 11 be increased by Vu with the instruction. Then, completely the same leakage current detection as described above is performed with the application voltage of V+Vu.

Further, if the application voltage V has reached Vmax in the step S6 after the repetition described above has been performed, a termination judgment of the conditioning process described later is performed while the application voltage is fixed to Vmax. It should be noted here that assuming that the actual use voltage of the electron gun is 50 kV, Vmax becomes about 1.6 times of that voltage, namely 80 kV.

As described above, in the present embodiment, application of the stepwise high voltage between the electrodes of the electron gun is performed by the automatic control by the PC 17 based on the leakage current between the electrodes in the conditioning process of the electron gun. Further, as shown in the waveform A of the leakage current IL of FIG. 3, if the discharge satisfying that the leakage current IL is equal to or larger than I1 occurs, the application voltage V drops by the voltage Vu. Further, as shown in the waveform B of the leakage current IL of the drawing, if the condition that the leakage current IL is smaller than I2 has not been satisfied because the microscopic discharge, for example, continues, the present voltage is held for a long period of time. On the contrary, if the condition that the leakage current IL is smaller than I2 is satisfied in a short period of time, the holding time of the present voltage becomes short. By thus operating as described above, the application voltage V becomes to have different holding time according to the leakage current IL, and increases stepwise from Vmin to Vmax as shown in the waveform of the application voltage of FIG. 3. As described above, there are some cases in which the voltage drop occurs on the contrary.

As the termination judgment of the conditioning process, when the application voltage V reaches Vmax in the step S6 shown in FIG. 2, while the constant voltage of Vmax is kept applying between the electrodes of the electron gun, the leakage current detection between the electrodes is performed. Then, if the leakage current IL is maintained equal to or smaller than a predetermined current value for a certain period of time previously determined, the conditioning process of the electron gun is terminated.

Here, if the leakage current IL between the electrodes is larger than a previously determined third reference value I3 in the step S9, the PC 17 sends an instruction for deboosting the application voltage V to the voltage adjustment section 12 in the step S10 to make the output voltage of the voltage supply section 11 be deboosted by a voltage Vd with the instruction. Then, the process returns again to the cycle described above in which the application voltage increases stepwise taking the leakage current IL as the basis. It should be noted here that the third reference value I3 corresponds to the massive discharge as the abnormal discharge, and can be set to be, for example, a current value exceeding the current drive capacity of the high voltage generator. In this case, if the leakage current IL becomes equal to or larger than the third reference value I3, the voltage drop of the high voltage generator should occur temporarily.

Further, if the leakage current IL between the electrodes is smaller than the third reference value I3 in the judgment in the step S9, and further, the leakage current IL is equal to or smaller than a previously determined fourth value I4 and is kept for a certain period of time in the judgment in the step S11, the conditioning process of the electron gun is terminated. Here, the fourth reference value I4 is set, for example, to 0.3 μA, and the certain period of time for keeping is set, for example, to about ten minutes.

Although in the past conditioning process of the electron gun, the application voltage between the electrodes is increased in the condition of boosting by a constant voltage with a constant period of time, in the present embodiment, the control of the application voltage is performed taking the leakage current IL as the basis as described above. For example, by taking the first reference value I1 described above as the basis, occurrence of the massive discharge caused between the electrodes of the electron gun is suppressed or prevented. Thus, the problems of the breakage of the surfaces of the electrodes and the insulators caused by the massive discharge, which has occurred in the past conditioning process at a high frequency, and of the shortage of the life of the electron gun accompanying the breakage can be solved. Further, by taking the second reference value I2 described above as the basis, the holding time period of the application voltage with the large leakage current is set longer to sufficiently remove the discharge factors. On the contrary, the shorter holding time period is set in the application voltage with a small amount of the leakage current. Thus, the more efficient and effective conditioning process than in the past case becomes possible.

Further, in the present embodiment, by taking the first reference value I1 described above as the basis, the microscopic protrusions, attachments, and impurities causing the microscopic discharge become to be sufficiently removed in the conditioning process. Further, since the adhesion of the fragments caused by the massive discharge described above is reduced, the abnormal discharge caused by the factors of the microscopic discharge in the actual use of the electron gun is dramatically reduced. It is confirmed that the frequency of the abnormal discharge, for example, which has occurred in the past conditioning processing method, is reduced to about a tenth by the present embodiment.

In the embodiment described above, the case in which the application voltage is boosted to a voltage one step higher by the voltage of Vu immediately when the leakage current IL reaches the predetermined value smaller than the second reference value I2 is explained. Here, in holding the application voltage, it is possible to set it so as to hold the voltage for a predetermined minimum period of time. In this case, the minimum holding time is set shorter than the constant time (e.g., one minute) in the related art.

Second Embodiment

Figure 4:
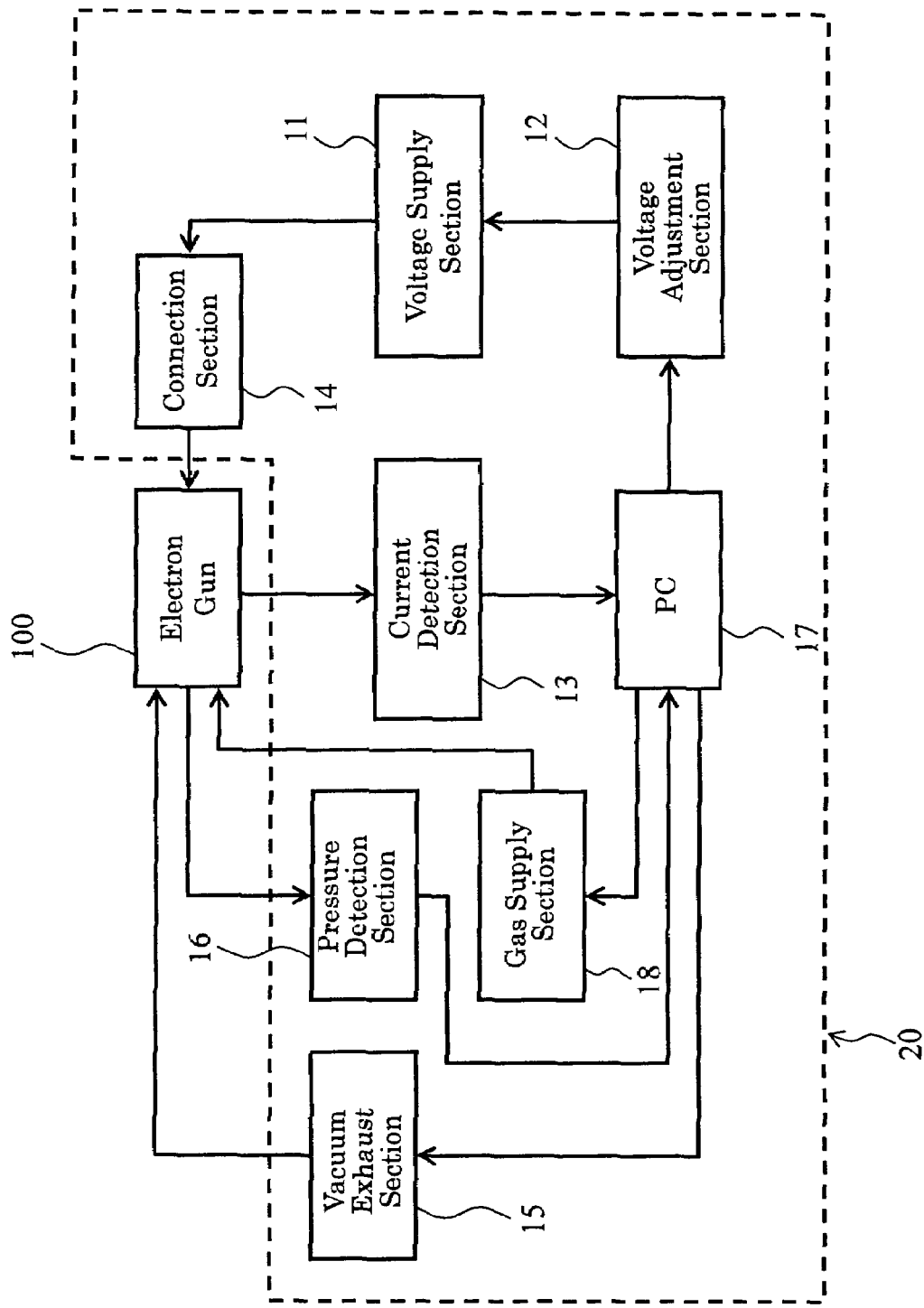
FIG. 4 is a schematic configuration diagram showing an example of a conditioning processing device of an electron gun according to a second embodiment.

The second embodiment has a feature of performing the conditioning process with a predetermined gas, with which the discharge is caused with relative ease, introduced inside the electron gun. FIG. 4 is a schematic configuration diagram showing an example of a conditioning processing device of an electron gun according to a second embodiment.

As shown in FIG. 4, the conditioning processing device 20 of the electron gun according to the second embodiment is provided with the voltage supply section 11 and the voltage adjustment section 12 for adjusting and supplying the high voltage to the electron gun 100, and the current detection section 13 for detecting the leakage current flowing between the electrodes of the electron gun 100 similarly to those explained in the first embodiment. Further, it is arranged that a negative high voltage is applied to the first electrodes 102 and the extraction electrode 107 connected via the connection section 14.

Further, a gas supply section 18 is provided for supplying a predetermined gas such as a nitrogen (N2) gas inside the electron gun 100 under control. Here, a vacuum exhaust section 15 and a pressure detection section 16 for adjusting the inside of the electron gun 100 to be in a reduced pressure condition in the predetermined gas atmosphere are attached.

Further, similarly to those explained in the first embodiment, it is arranged that the PC 17 performs data processing of the detection data such as the leakage current detected by the current detection section 13 or the magnitude relation with the reference value, or the degree of vacuum inside the electron gun detected by the pressure detection section 16, and performs overall control of the conditioning processing device 10.

The gas supply section 18 forming the atmosphere control unit is provided with a gas flowmeter or a pressure control valve and is arranged to control the amount of introduction of the predetermined gas into the electron gun 100. In this case, it is preferable to have a structure of causing a gas flow, for example, from the upper part to the lower part inside the electron gun.

The vacuum exhaust section 15 is a vacuum exhaust device equipped with the vacuum pump, similarly to those explained in the first embodiment, what controls the degree of vacuum inside the electron gun with pressure as low as $10^{-1}$ Pa or less is preferable. Here, the predetermined gas introduced in the electron gun 100 from the gas supply section 18 is pressure-controlled by the vacuum exhaust section 15 via the PC 17.

The PC 17 has the same configuration as explained in the first embodiment, and controls the amount of introduction of the predetermined gas from the gas supply section 18 in accordance with the detection data from the pressure detection section 16.

Further, other sections, namely the voltage supply section 11, the voltage adjustment section 12, the current detection section 13, and the pressure detection section 16 have the same configuration as explained in the first embodiment.

In the conditioning processing method of the electron gun according to the second embodiment, the inside of the electron gun 100 is filled, for example, with $N_2$ gas, and the pressure thereof is set to $10^{-1}$ Pa, which is about $10^4$ times as high as the case with the first embodiment. Then, as explained in the first embodiment, taking the leakage current IL between the electrodes of the electron gun as the basis, the application voltage between the electrodes is increased stepwise to perform the conditioning process of the electron gun. Further, also in the termination judgment of the conditioning process of this case, the same process is performed as explained in the first embodiment except that the inside the electron gun 100 is in the atmosphere of the predetermined gas. It should be noted that the holding time of the application voltage of Vmax is set to about two hours.

Figure 5:
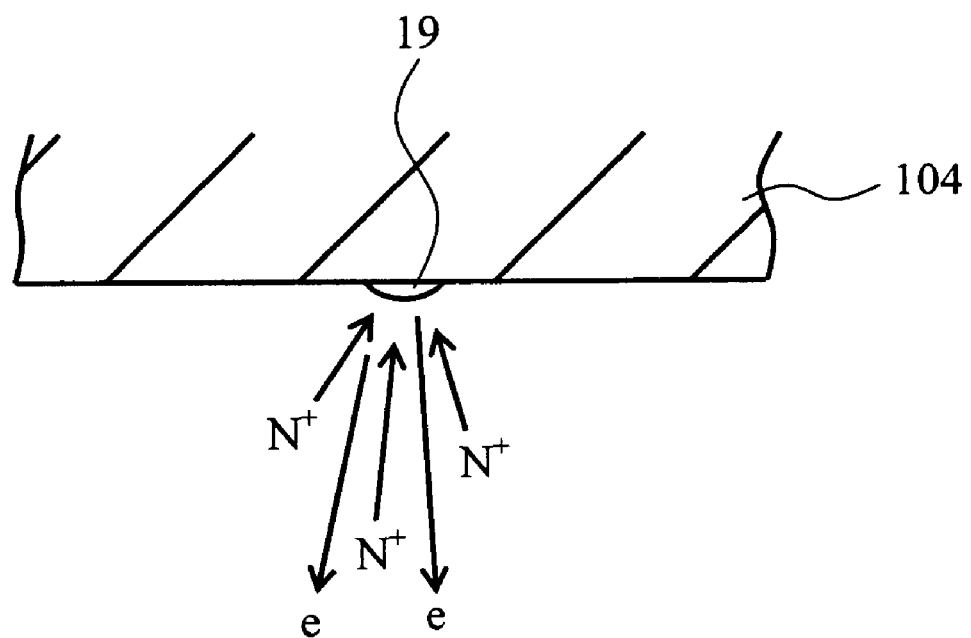
FIG. 5 is a schematic diagram for explaining the effectiveness of the second embodiment.
Figure 5:
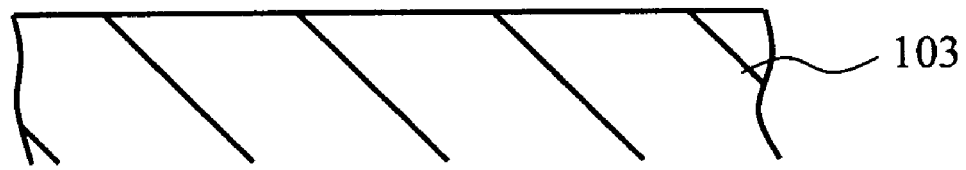

In the second embodiment, the discharge inside the electron gun more easily occurs in the conditioning process of the electron gun than in the case with the first embodiment, and accordingly, the removal of the discharge factors described above by the electrode spark erosion becomes easy. This point will be explained with reference to FIG. 5. FIG. 5 is a schematic view between the second electrode 103 and the third electrode 104 and for explaining the effectiveness.

As shown in FIG. 5, in the condition in which the second electrode 103 is grounded and the high negative voltage is applied to the third electrode 104, if a discharge factor 19 such as a protruding section, an attachment, an impurity exists on the surface of the third electrode 104, a high electric field is caused around the discharge factor 19, and the primary electron is emitted from the discharge factor 19. Then, the primary electron collides against the predetermined gas existing between the electrodes such as $N_2$ gas, and ionizes the $N_2$ gas. Then, the nitrogen ion $N^+$ charged positively is attracted to the side of the discharge factor 19 by the high electric field described above and accelerated to remove the discharge factor 19 by sputtering. By the charging of the predetermined gas, the electrode spark erosion described above is enhanced.

Further, the $N^+$ ion obtained by ionizing the $N_2$ gas reacts with the metal such as iron or chromium on the surface of the electrode made, for example, of stainless steel to form a nitride film as an insulator in the area of the discharge factor 19. This insulating film further reduces the discharge.

Further, the predetermined gas exists about $10^4$ times as many as in the case with the first embodiment, and has an advantage of suppressing adhesion of the fragments by the gas curtain effect. For example, even if a massive discharge occurs in the conditioning process of the electron gun, and the fragments caused by the discharge are scattered between the electrodes, the fragments are blocked by the predetermined gas and adhesion thereof is reduced. In this case, if a gas flow in a certain direction is caused in the predetermined gas, the fragments are carried along the flow, thus the adhesion reduction effect is enhanced.

In the present embodiment, the same advantages as explained in the first embodiment can be obtained. Further, by introducing the predetermined gas as described above, removal of the discharge factor by the electrode spark erosion becomes easier than in the case with the first embodiment. Further, even if the massive discharge occurs in the conditioning process, the adhesion of the fragments caused accordingly is suppressed, the abnormal discharge caused by the adhesion of the fragment is dramatically reduced in the actual operation of the electron gun.

In the termination judgment of the conditioning process of the second embodiment, it is possible that after keeping the application voltage of Vmax for about two hours in the predetermined gas atmosphere, the inside the electron gun is evacuated to be about $10^{-5}$ Pa similarly to the case with the first embodiment, and then the application voltage is further kept at Vmax for about ten minutes. Thus, the amount of the predetermined gas absorbed on the surfaces of the electrodes and the surfaces of the insulators of the electron gun can be reduced.

Hereinabove, although the preferred embodiments of the present invention are explained, the embodiments described above do not limit the scope of the present invention. Those skilled in the art can add various modifications and alterations to the specific embodiments within the spirit and the scope of the present invention.

For example, although in the above embodiments the case in which the conditioning process is performed by the personal computer is explained, a data processing unit with any configurations can be used providing it performs data processing of the detection data regarding the leakage current supplied from the current detection section 13, and controls the output voltage of the voltage supply section 11 via the voltage adjustment section 12 using the processed data. Here, it is possible to provide a control section for collectively controlling the conditioning process.

Further, although in the conditioning process the reduced pressure is provided to the inside of the electron gun, the conditioning process at normal pressure is also possible. In this case, the vacuum exhaust section 15 and the pressure detection section 16 are not necessarily required.

Further, in the conditioning process of the electron gun, the termination judgment step for maintaining the application voltage of Vmax for a certain period of time can be eliminated.

Further, in the judgment of the magnitude of the leakage current IL detected by the current detection section 13 and the reference value thereof, "equal to or larger than" can be interchanged with "larger than" and "equal to or smaller than" can be interchanged with "smaller than."

Still further, although in the embodiments described above, the case in which the first electrodes 102 and the third electrode 104 are short-circuited with the connection section 14 is explained, it is possible that the bias power source 109 intervenes therebetween.

Further, the conditioning processing method of the electron gun according to the present invention is not limited to the method using the conditioning processing device explained with reference to FIG. 1 or FIG. 4, but can use any other processing devices.

What is claimed is:

1. A conditioning processing method of an electron gun, comprising the steps of:
   removing a discharge factor existing on a surface of one of an electrode and an insulator by increasing voltage applied to the electrode stepwise and gradually, the electrode and the insulator forming an electron gun;
   detecting a leakage current; and
   controlling the voltage in accordance with the leakage current.

2. The conditioning processing method of an electron gun according to claim 1, wherein
   the voltage is boosted stepwise to a voltage one step higher when the leakage current flowing in the electrode reaches a value one of smaller than and no greater than a first reference value.

3. The conditioning processing method of an electron gun according to one of claims 1 and 2, wherein
   the conditioning process is continued after the voltage is deboosted to a voltage one step lower when the leakage current flowing in the electrode is one of no smaller than and larger than a second reference value larger than the first reference value.

4. The conditioning processing method of an electron gun according to any one of claims 1 and 2, further comprising the step of:
   performing a termination judgment of the conditioning process of an electron gun after the voltage applied to the electrode is boosted to a voltage higher than an actual use voltage of the electron gun, and the voltage higher than the actual use voltage is continued applying for a certain period of time.

5. The conditioning processing method of an electron gun according to claim 1, further comprising the step of
   eliminating a current corresponding to a capacitance charging current of a high voltage generator as a power source of the application voltage from the detected leakage current.

6. A conditioning processing device of an electron gun, removing a discharge factor existing on a surface of one of an electrode and an insulator by increasing voltage applied to the electrode stepwise and gradually, the electrode and the insulator forming an electron gun, comprising:
   a voltage supply for supplying a stepwise voltage;
   a leakage current detector for detecting a leakage current of the electrode in accordance with application of the voltage;
   a data processor for processing detection data from the leakage current detector; and
   a voltage adjuster for adjusting the voltage supplied from the voltage supply in accordance with processing data from the data processor.

7. The conditioning processing device of an electron gun according to claim 6, wherein
   the voltage adjuster boosts the voltage stepwise to a voltage one step higher when the leakage current flowing in the electrode reaches a value one of smaller than and no greater than a first reference value.

8. The conditioning processing device of an electron gun according to claim 6, wherein
   the voltage adjuster deboosts the voltage to a voltage one step lower when the leakage current flowing in the electrode is one of no smaller than and larger than a second reference value larger than the first reference value.

9. The conditioning processing device of an electron gun according to claim 6, wherein
   the voltage supply is capable of supplying a negative high voltage, connected in the negative side to an electrode of the electron gun, and grounded in the positive side via a discharge protective resistor.

10. The conditioning processing device of an electron gun according to claim 6, wherein
    the leakage current detector detects a voltage caused in the resistor in the positive side of the high voltage generator.

11. The conditioning processing device of an electron gun according to claim 6, wherein
    the leakage current detector has a structure for measuring a current of an induction coil electromagnetically coupled with a conductive wire with which the positive side of the high voltage generator is grounded.

12. The conditioning processing device of an electron gun according to claim 6, wherein the electron gun is capable of being filled with nitrogen gas inside the electron gun.

13. The conditioning processing device of an electron gun according to claim 6, wherein the data processor is a digital data processing device.

14. The conditioning processing method of an electron gun according to claim 3, further comprising the step of: performing a termination judgment of the conditioning process of an electron gun after the voltage applied to the electrode is boosted to a voltage higher than an actual use voltage of the electron gun, and the voltage higher than the actual use voltage is continued applying for a certain period of time.

* * * * *